(12) United States Patent
Lee

(10) Patent No.: US 6,949,431 B2
(45) Date of Patent: Sep. 27, 2005

(54) METHOD FOR FABRICATING CYLINDER TYPE CAPACITOR

(75) Inventor: Chang-Goo Lee, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/879,749

(22) Filed: Jun. 30, 2004

(65) Prior Publication Data

US 2005/0142869 A1    Jun. 30, 2005

(30) Foreign Application Priority Data

Dec. 29, 2003 (KR) ...................... 10-2003-0098551

(51) Int. Cl.[7] .......................................... H01L 21/8242
(52) U.S. Cl. ..................................... 438/253; 438/396
(58) Field of Search ............................... 438/253, 254, 438/396, 745

(56) References Cited

U.S. PATENT DOCUMENTS 6,383,867 B1 * 5/2002 Kim et al. .................. 438/253
6,878,601 B1 * 4/2005 Kim ........................... 438/386

* cited by examiner

*Primary Examiner*—David Nelms
*Assistant Examiner*—Quoc Hoang
(74) *Attorney, Agent, or Firm*—McDermott Will & Emery LLP

(57) ABSTRACT

Disclosed is a method for fabricating a cylinder type capacitor in a semiconductor device. Particularly, the cylinder type capacitor is fabricated through performing a series of processes. Among the serial processes, a cleaning process for removing a photosensitive layer remaining in undesired regions is performed before an etch-back process for forming bottom electrodes with use of the photosensitive layer as an etch mask. Especially, the cleaning process proceeds by employing one of a dry etching process and a wet etching process.

10 Claims, 5 Drawing Sheets

CLEANING ($H_2SO_4+H_2O_2$)

METHOD FOR FABRICATING CYLINDER TYPE CAPACITOR

FIELD OF THE INVENTION

The present invention relates to a method for fabricating a semiconductor device; and more particularly, to a method for fabricating a cylinder type capacitor.

DESCRIPTION OF RELATED ARTS

As a minimum linewidth and a degree of integration of a semiconductor device have been increased, an area in which a capacitor is formed has been decreased. Accordingly, although the area in which a capacitor is formed has been decreased, the capacitor inside of a cell should ensure capacitance of greater than 25 pF which is the least required amount per cell. Thus, there have been suggested various methods to form a capacitor that has high capacitance within a limited area. One suggested method is to form a dielectric layer with a high electric permittivity such as $Ta_2O_5$, $Al_2O_3$ or $HfO_2$, replacing a silicon dioxide layer having a dielectric constant ($\epsilon$) of 3.8 and a nitride layer having a dielectric constant ($\epsilon$) of 7. Another suggested method is to effectively increase an area of a bottom electrode by forming the bottom electrode with a three-dimensional type such as a cylinder type or a concave type, or by increasing an effective surface area of a bottom electrode 1.7 to 2 times more through growing metastable polysilicon (MPS) grains on the surface of the bottom electrode. Another suggested method is to form a capacitor in a metal-insulator-metal (MIM) structure by forming a bottom electrode and an upper electrode with a metal layer.

FIGS. 1A to 1C are cross-sectional views illustrating a conventional method for fabricating a MIM capacitor in a semiconductor device.

Referring to FIG. 1A, a field oxide layer 12 for isolating device elements is formed in a substrate 11 for isolating device elements. A plurality of word lines W formed by sequentially stacking a gate oxide layer 13, a gate electrode 14 and a gate hard mask 15 are formed on the substrate 11. Afterwards, a gate spacer 16 is formed on each sidewall of the word lines W, and a plurality of sources/drains 17A and 17B are formed in predetermined portions of the substrate 11 disposed between the word line W.

Next, a first inter-layer insulating layer 18 is formed on the above resulting substrate structure and is etched to thereby form a plurality of contact holes (not shown) each exposing the corresponding source/drain 17A or 17B. A polysilicon layer is filled into the contact holes and is then polished chemically and mechanically, thereby forming landing plugs 19A and 19B. Herein, the polysilicon layer is chemically and mechanically polished until surfaces of the word lines are exposed. Also, reference numerals 19A and 19B denote a first landing plug and a second landing plug, respectively.

Next, a second inter-layer insulating layer 20 is formed on the above resulting substrate structure. Then, the second inter-layer insulating layer 20 is subjected to a planarization process. A bit line contact hole 100 is formed by etching the second inter-layer insulating layer 20. Herein, the bit line contact hole 100 exposes one of the landing plugs 19A and 19B, i.e., the first landing plug 19A. A bit line 21 connected to the first landing plug 19A through the bit line contact hole 100 is formed thereafter.

Next, a third inter-layer insulating layer 22 is formed on the second inter-layer insulating layer 20 and the bit line 21 and is then subjected to a planarization process. Thereafter, a plurality of storage node contact holes 200 exposing the second landing plugs 19B is formed by etching the third inter-layer insulating layer 22 and the second inter-layer insulation layer 20, and then the storage node contact holes 200 are filled with a predetermined plug material, thereby forming a plurality of storage node contact plugs 23.

Next, an etch barrier layer 24 and a fourth inter-layer insulating layer 25 are sequentially formed on the third inter-layer insulating layer 22 and the storage node contact plugs 23. A plurality of holes 26 each exposing a surface of each storage node contact 23 are formed by etching the fourth inter-layer insulating layer 25.

Next, a titanium nitride (TiN) layer 27 used as a bottom electrode is deposited on the fourth inter-layer insulating layer 25 and the holes 26. Afterwards, a photosensitive layer 28 is formed on the TiN layer 27.

Referring to FIG. 1B, the photosensitive layer 28 is etched back without using a mask, so that the photosensitive layer 28 remains only inside of the hole. This remaining photosensitive layer is denoted with a reference numeral 28A. Next, the titanium nitride layer 27 is etched back with use of the remaining photosensitive layer 28A as an etch barrier, thereby obtaining a plurality of cylinder type bottom electrodes 27A remaining inside of the holes 26. Herein, the bottom electrode 27A is made of TiN.

Referring to FIG. 1C, the remaining photosensitive layer 28A is removed, and the fourth inter-layer insulating layer 25 is subsequently removed through a wet dip-out process. From these removals, the cylinder type bottom electrodes 27A are isolated.

However, as shown in FIGS. 1B and 1C, there is a problem observed when the photosensitive layer 28 still remains in undesired regions because of the thickly formed photosensitive layer 28 although the photosensitive layer 28 introduced for isolating the bottom electrodes 27A is intended to remain only inside of the holes 26. A portion of the photosensitive layer 28 remaining in the undesired regions is denoted with a reference numeral 28B. This undesirable remaining portion 28B of the photosensitive layer 28 results in another problem. That is, when the TiN layer 27 is etched back, a portion of the TiN 27 residing in the same region where the undesirable remaining portion 28B of the photosensitive layer 28 exists is not isolated. This non-isolated portion of the TiN layer 27 is expressed with a reference numeral 27B.

In addition, after the wet dip-out process applied to the third interlayer insulating layer the bottom electrodes 27A are clung each other due to the non-isolated portion 27B of the TiN layer 27. This phenomenon is called bridge formation.

On the other hand, the bridge phenomenon is not happened in case that the TiN layer is etched back without using the photosensitive layer during the bottom electrode isolation process. However, there may be a problem that the bottom electrodes are greatly damaged during the etch back process.

SUMMARY OF THE INVENTION

It is, therefore, an object of the present invention to provide a method for fabricating a cylinder type capacitor for preventing a bridge formation between bottom electrodes caused by a photosensitive layer remaining in undesired regions during a bottom electrode isolation process using the photosensitive layer.

In accordance with an aspect of the present invention, there is provided a method for fabricating a cylinder type capacitor, including the steps of: sequentially forming an etch barrier layer and an inter-layer insulating layer on a substrate provided with storage node contacts; etching the inter-layer insulating layer to form a plurality of holes exposing the storage node contacts; forming a metal layer on the holes and the inter-layer insulating layer; forming a photosensitive layer on the metal layer; performing a blanket photo-exposure process to make the photosensitive layer remain inside of the holes; performing a cleaning process to remove portions of the photosensitive layer remaining in regions except for the holes; etching back the metal layer with use of the photosensitive layer remaining inside of the holes as an etch barrier to thereby form a plurality of cylinder type bottom electrodes inside of the holes; removing the photosensitive layer; performing a wet deep-out process to remove the inter-layer insulating layer; and sequentially forming a dielectric layer and an upper electrode on each of the cylinder type bottom electrodes.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a cylinder type capacitor in accordance with a preferred embodiment of the present invention will be described in detail with reference to the accompanying drawings.

FIGS. 2A to 2E are cross-sectional views illustrating a method for fabricating a cylinder type capacitor in accordance with a preferred embodiment of the present invention.

Figure 1A:
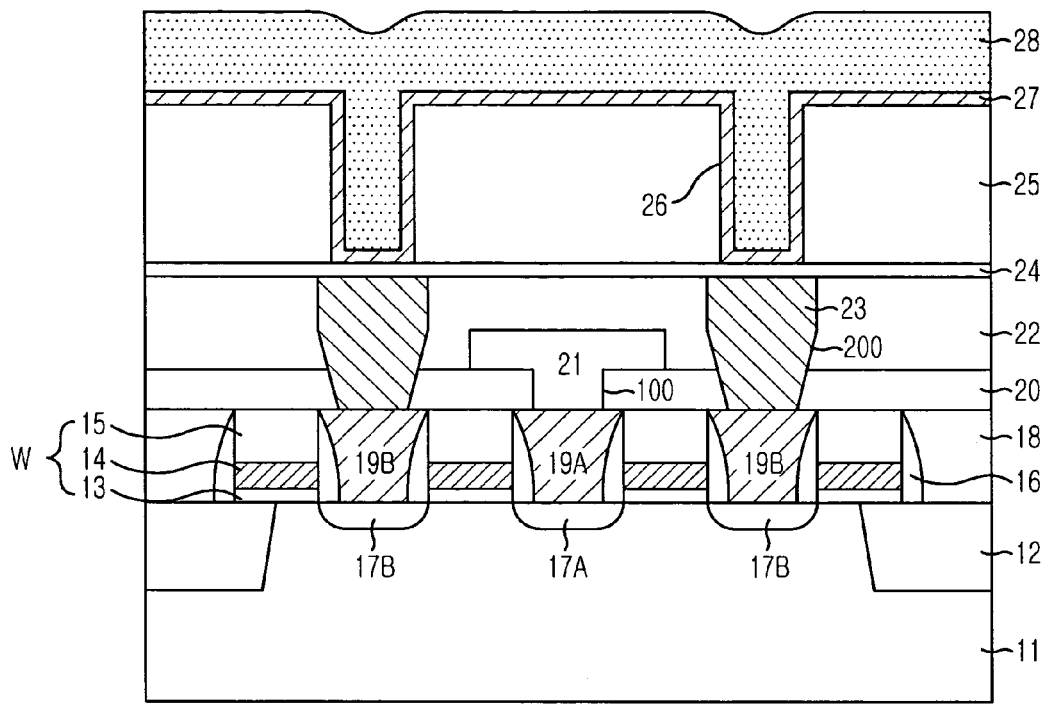
FIGS. 1A to 1C are cross-sectional views showing a conventional method for fabricating a cylinder type metal-insulator-metal capacitor in a cylinder type.
Figure 1B:
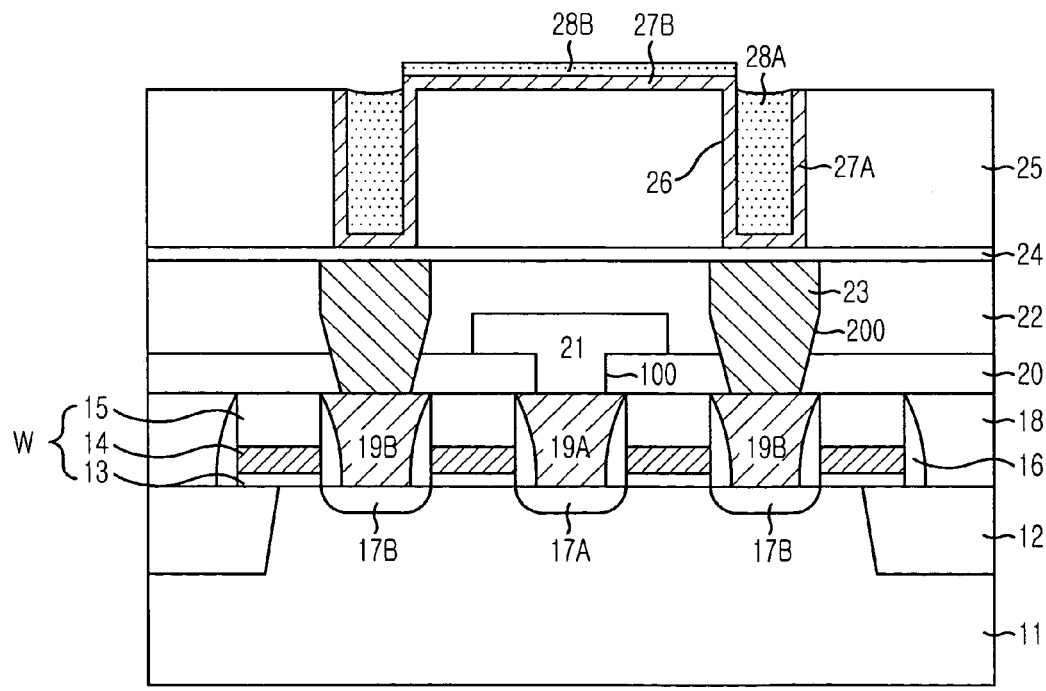
Figure 1C:
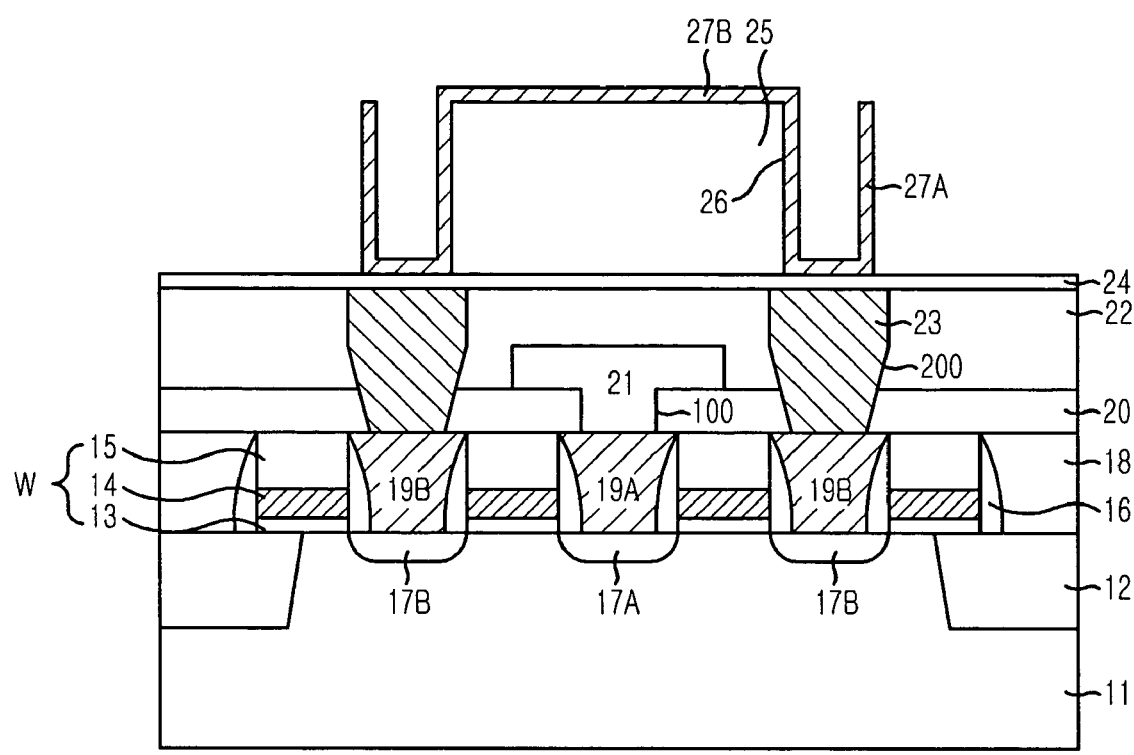
Figure 2A:
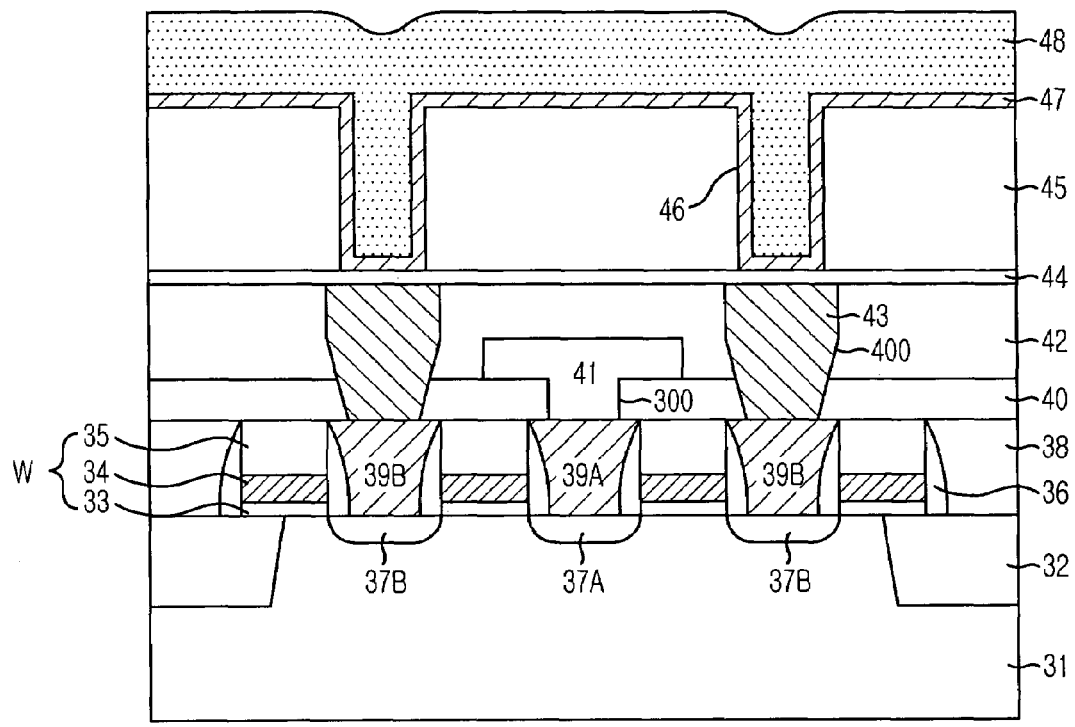
FIGS. 2A to 2E are cross-sectional views showing a method for fabricating a cylinder type capacitor in accordance with a preferred embodiment of the present invention.

Referring to FIG. 2A, a field oxide layer 32 for isolating device elements is formed on a substrate 31, and a plurality of word lines W including a gate oxide layer 33, a gate electrode 34 and a gate hard mask 35 are formed on the substrate 31. Afterwards, a gate spacer 35 is formed on each sidewall of the word lines W, and a plurality of sources/drains 37A and 37B are formed in predetermined portions of the substrate 31 disposed between the word lines W.

Next, a first inter-layer insulating layer 38 is formed on the resulting substrate structure and is then etched to obtain a plurality of contact holes (not shown) each exposing the corresponding source/drain 37A or 37B. A polysilicon layer is filled into the contact holes and is chemically and mechanically polished until a surface of each word line W is exposed. From this chemical mechanical polishing (CMP) process, landing plugs 39A and 39B are formed. Herein, reference numerals 39A and 39B denote a first landing plug and a second landing plug, respectively.

Next, a second inter-layer insulating layer 40 is formed on the resulting substrate structure and is planarized thereafter. A bit line contact hole 300 exposing one of the landing plugs 39A and 39B, i.e., the first landing plug 39A, is formed by etching the second inter-layer insulating layer 40. A bit line 41 connected to the first landing plug 39A through the bit line contact hole is formed.

Afterwards, a third inter-layer insulating layer 42 is formed on the above resulting substrate structure and is planarized thereafter. A plurality storage node contact holes 400 exposing the second landing plugs 39B are formed by etching the third inter-layer insulating layer 42 and the second inter-layer insulation layer 40, and a material for forming a storage node contact plug is buried in the storage node contact holes 400. Herein, the material for forming the storage node contact plug is polysilicon. Then, the buried material is etched back to form a plurality of storage node contact plugs 43.

Next, an etch barrier layer 44 and a fourth inter-layer insulating layer 45 are sequentially formed on the third inter-layer insulating layer 42 and the storage node contact plugs 43 and are planarized thereafter. A plurality of holes 46 exposing the storage node contact plugs 43 are formed by etching the fourth inter-layer insulating layer 45.

Next, a titanium nitride (TiN) layer 47 for forming a bottom electrode is formed on the fourth inter-layer insulating layer 45 and the holes 46. Herein, before the TiN layer 47 is formed, a titanium silicide ($TiSi_2$) layer can be formed on the storage node contact plugs 43 for forming an omic contact between the storage node contact plug 43 and a subsequent bottom electrode in order to improve a contact resistance. For instance, a $TiSi_2$ layer is formed by a heat treatment after titanium is formed on an entire surface of the substrate structure obtained before the formation of the TiN layer 47. Then, non-reacted titanium molecules are removed by using a chemical solution of SC-1 maintained with a high temperature ranging from approximately 50° C. to approximately 100° C. Herein, the SC-1 chemical solution is obtained by mixing $NH_4OH$ and $H_2O_2$.

Then, the photosensitive layer 48 is formed on the above TiN layer 47 in advance of a bottom electrode isolation process.

Figure 2B:
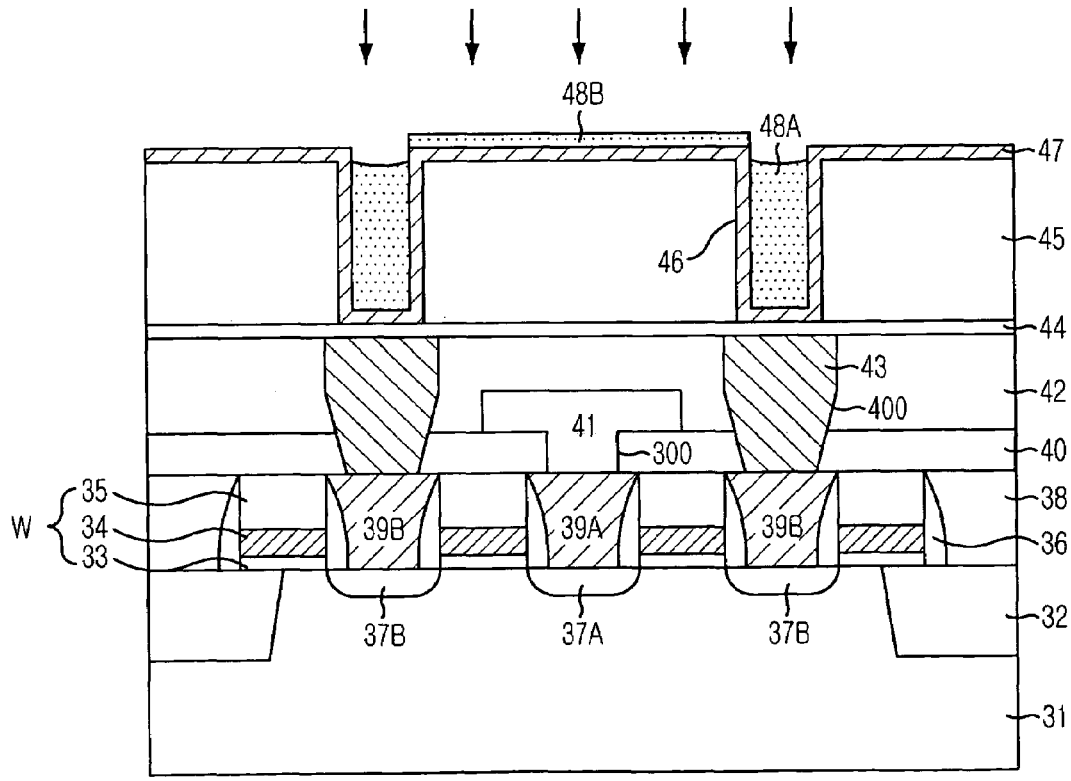

Referring to FIG. 2B, the photosensitive layer 48 is subjected to a blanket photo-exposure process without using a mask under a target that the photosensitive layer 48 remains only inside of the holes 46. Hereinafter, the predetermined portions of the photosensitive layer 48 remaining inside of the holes 46 will be referred to as an intentionally remaining photosensitive layer denoted with a reference numeral 48A.

On the other hand, because the photosensitive layer 48 can remain in regions other than the holes 46 even after the blanket photo-exposure, a cleaning process additionally proceeds in order to remove undesirably remaining portions of the photosensitive layer 48 remaining in undesired regions. Hereinafter, the photosensitive layer 48 remaining in the regions other than the holes 46 will be referred to as an unintentionally remaining photosensitive layer denoted with a reference numeral 48B.

Figure 2C:
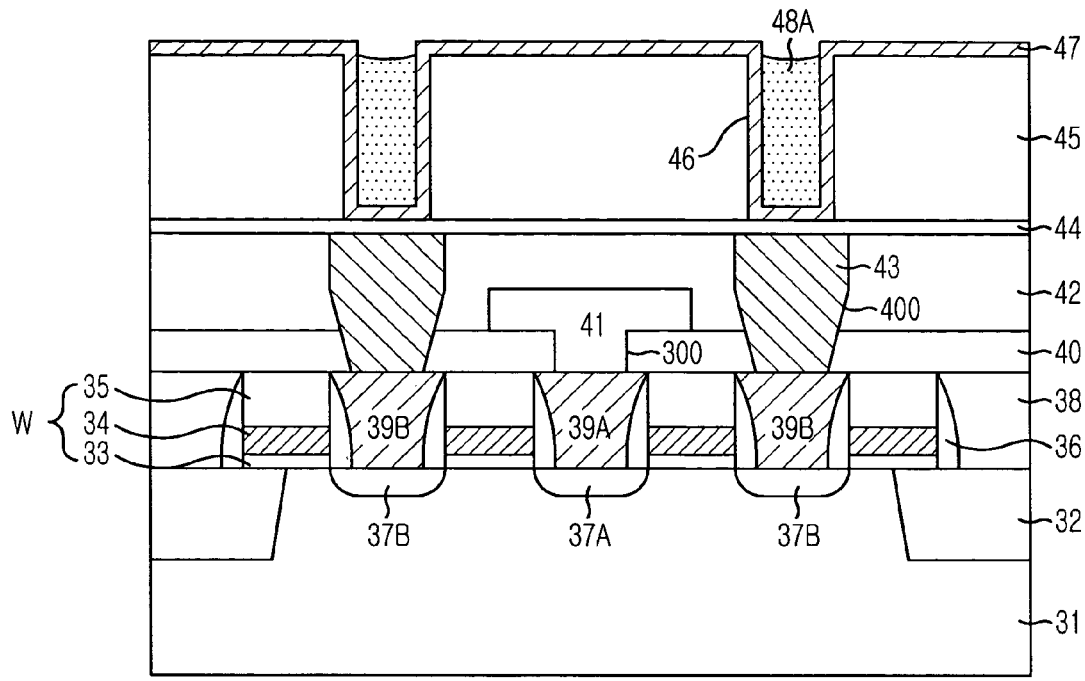

FIG. 2C is a diagram showing a resulting substrate structure obtained by removing the unintentionally remaining photosensitive layer 48B through the cleaning process.

At this time, the cleaning process proceeds under a condition that the cleaning process does not affect the TiN layer 47 that later becomes a bottom electrode.

As the first scheme for the cleaning process shown in FIG. 2B, a wet etching process can be employed to remove the unintentionally remaining photosensitive layer 48B by using a mixed solution of sulfuric acid-peroxide mixtures (SPM) obtained by mixing sulfuric acid ($H_2SO_4$) and hydrogen peroxide ($H_2O_2$). Here, if a mixing ratio of Hydrogen peroxide ($H_2O_2$) is high, the TiN layer 47 being made of a metal-based material can be dissolved. Thus, the removal of the TiN layer 47 can be prevented by relatively lowering the mixing ratio of hydrogen peroxide ($H_2O_2$).

As the second scheme for the cleaning process, the unintentionally remaining photosensitive layer 48B is removed by using sulfuric acid ($H_2SO_4$). At this time, the sole use of $H_2SO_4$ makes it possible to prevent the TiN layer 47 from being dissolved as simultaneously as to remove selectively the unintentionally remaining photosensitive layer 48B.

As the third scheme for the cleaning process, a dry etching process using ozone ($O_3$) is applicable to the cleaning process because the unintentionally remaining the photosensitive layer 48B is easily removed through this dry etching process.

As illustrated in the above, the intentionally remaining photosensitive layer 48A can be partially consumed during the cleaning process carried out for removing the unintentionally remaining photosensitive layer 48B. However, because the unintentionally remaining the photosensitive layer 48B is very thin, the cleaning process can proceed within a short time. Therefore, it is possible to reduce a damage to the intentionally remaining portion of the photosensitive layer 48A.

Figure 2D:
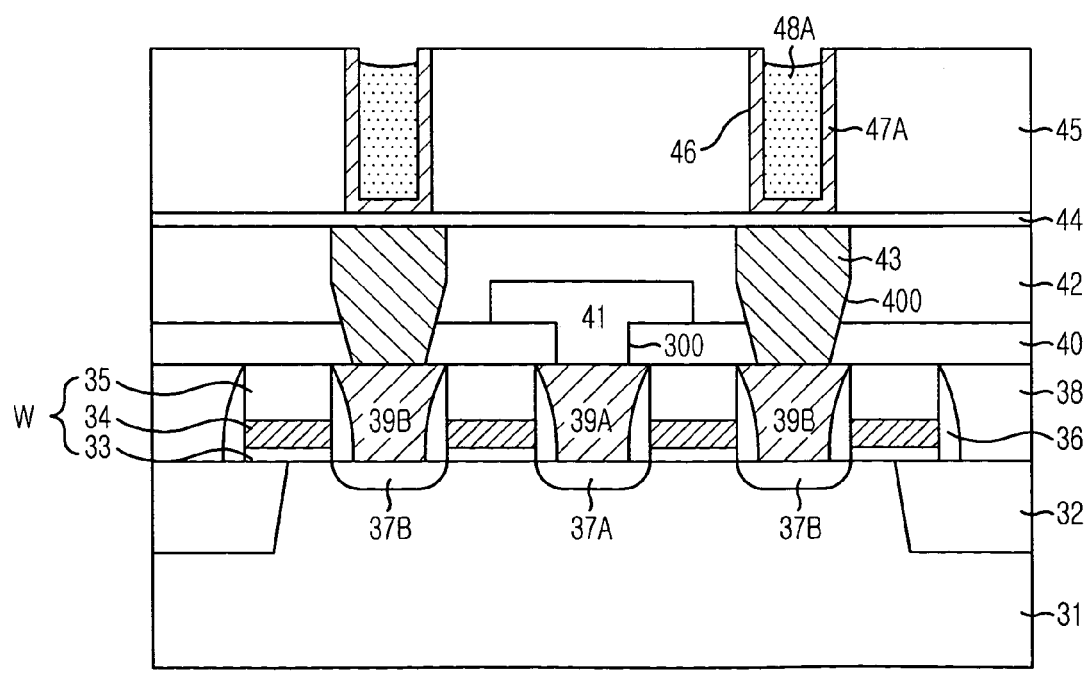

Next, as shown in FIG. 2D, the TiN layer 47 shown in FIG. 2C is subjected to an etch-back process by using the intentionally remaining photosensitive layer 48A remained in the hole 46 as an etch barrier. Then, cylinder type TiN-bottom electrodes remain only inside of the holes 46.

Figure 2E:
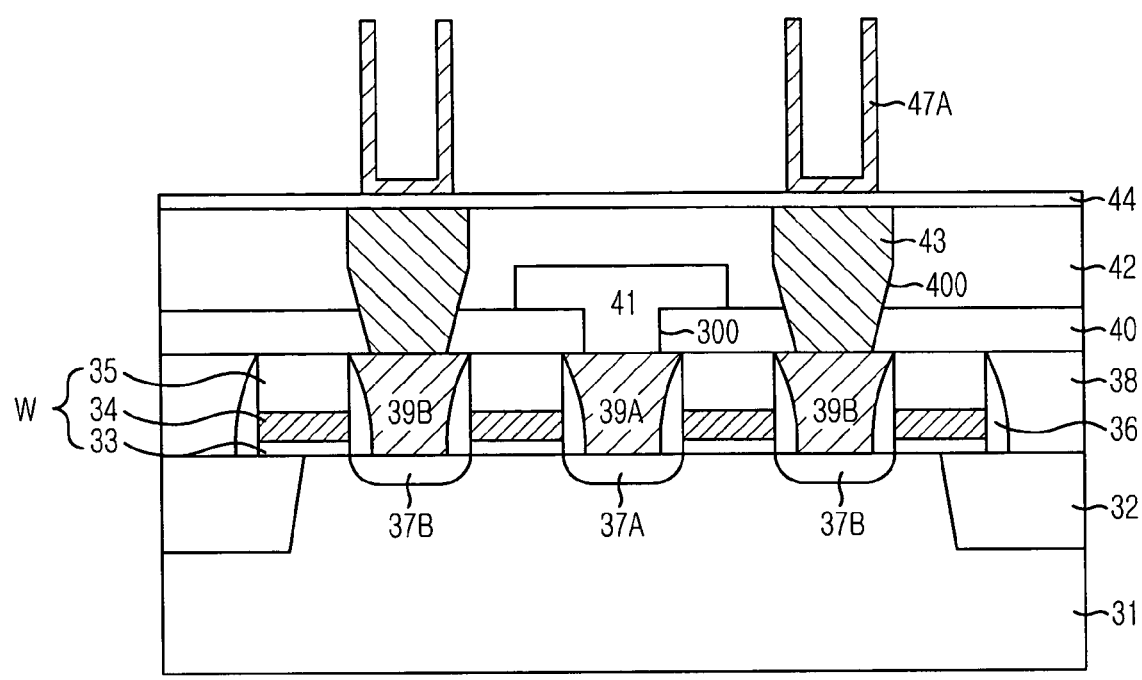

Referring to FIG. 2E, the intentionally remaining photosensitive layer 48A is removed through a photoresist stripping process. Subsequent to the photoresist stripping process, a wet dip-out process is carried out to remove the fourth inter-layer insulating layer 45, thereby exposing the cylinder type bottom electrodes 47A.

Although not illustrated, formation of a metal-insulator-metal (MIM) capacitor is completed by sequentially forming a dielectric layer and a metal layer, used as an upper electrode, on the cylinder type bottom electrodes 47A.

In accordance with the preferred embodiment of the present invention, there is an effect of preventing an incidence of bridge phenomenon between the bottom electrodes caused by the unintentionally remaining photosensitive layer by removing the photosensitive layer remaining in undesired regions.

In addition, there is also another effect of securing a characteristic of the bottom electrode by using a special chemical solution such as SPM, sulfuric acid, or ozone that selectively removes the photosensitive layer remaining in undesired regions as simultaneously as prevents the TiN layer that later becomes the bottom electrode from being etched away.

The present application contains subject matter related to the Korean patent application No. KR 2003-0098551, filed in the Korean Patent Office on Dec. 29, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a cylinder type capacitor, comprising the steps of:
    sequentially forming an etch barrier layer and an inter-layer insulating layer on a substrate provided with storage node contacts;
    etching the inter-layer insulating layer to form a plurality of holes exposing the storage node contacts;
    forming a metal layer on the holes and the inter-layer insulating layer;
    forming a photosensitive layer on the metal layer;
    performing a blanket photo-exposure process to make the photosensitive layer remain inside of the holes;
    performing a cleaning process to remove portions of the photosensitive layer remaining in regions except for the holes;
    etching back the metal layer with use of the photosensitive layer remaining inside of the holes as an etch barrier to thereby form a plurality of cylinder type bottom electrodes inside of the holes;
    removing the photosensitive layer;
    performing a wet deep-out process to remove the inter-layer insulating layer; and
    sequentially forming a dielectric layer and an upper electrode on each of the cylinder type bottom electrodes.

2. The method of claim 1, wherein the cleaning process proceeds by performing a wet etching process selectively removing the photosensitive layer as simultaneously as preventing the metal layer from being etched.

3. The method of claim 2, wherein the cleaning process is performed by using a mixed solution of sulfuric acid-peroxide mixtures (SPM) obtained by mixing sulfuring acid ($H_2SO_4$) and hydrogen peroxide ($H_2O_2$).

4. The method of claim 2, wherein the cleaning process is performed by using the sulfuric acid ($H_2SO_4$).

5. The method of claim 1, wherein the cleaning process proceeds by employing a dry etching process selectively remaining the photosensitive layer as simultaneously as preventing the metal layer from being etched.

6. The method of claim 5, wherein the cleaning process is performed by using ozone ($O_3$).

7. The method of claim 1, wherein the cleaning process is performed by using a mixed solution of sulfuric acid-peroxide mixtures (SPM) obtained by mixing sulfuric acid ($H_2SO_4$) and hydrogen peroxide ($H_2O_2$).

8. The method of claim 1, wherein the cleaning process is performed by using the sulfuric acid ($H_2SO_4$).

9. The method of claim 1, wherein the cleaning process is performed by using ozone ($O_3$).

10. The method of claim 1, wherein the bottom electrode is made of titanium nitride.

\* \* \* \* \*